United States Patent
Liu

(10) Patent No.: US 7,519,936 B2
(45) Date of Patent: Apr. 14, 2009

(54) UNALLOCATABLE SPACE DEPICTING SYSTEM AND METHOD FOR A COMPONENT ON A PRINTED CIRCUIT BOARD

(75) Inventor: Ming-Chieh Liu, Guangdong (CN)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 384 days.

(21) Appl. No.: 11/308,920

(22) Filed: May 25, 2006

(65) Prior Publication Data
US 2007/0150848 A1    Jun. 28, 2007

(30) Foreign Application Priority Data
Dec. 23, 2005    (CN)    .................. 2005 1 0121209

(51) Int. Cl.
*G06F 17/50*    (2006.01)
(52) U.S. Cl. ............................... 716/15; 716/5
(58) Field of Classification Search ............ 716/1, 716/4–5, 8–11, 15
See application file for complete search history.

(56) References Cited

U.S. PATENT DOCUMENTS

| | | | |
|---|---|---|---|
| 5,745,371 A * | 4/1998 | Shouen | ............ 716/15 |
| 5,838,583 A | 11/1998 | Varadarajan et al. | |
| 6,879,934 B1 | 4/2005 | Teig et al. | |
| 2004/0049758 A1 * | 3/2004 | Ueda et al. | ............ 716/15 |
| 2005/0257182 A1 | 11/2005 | Dong | |
| 2006/0294489 A1 * | 12/2006 | Tai et al. | ............ 716/15 |

* cited by examiner

*Primary Examiner*—Paul Dinh
(74) *Attorney, Agent, or Firm*—Winston Hsu

(57) ABSTRACT

An unallocatable space depicting system is provided for depicting an unallocatable space for a component. The component forms a component shape on a printed circuit board layout. The unallocatable space depicting system includes a detecting module, a comparison module, and an incorporating module. The detecting module is used for detecting used shapes in the component shape and a gap in the used shape. The comparison module is used for comparing a width of a detected gap with a required width. The incorporating module is used for incorporating the gap whose width is less than the required width with the used shape to construct the unallocatable space. A related unallocatable space depicting method and a storage medium recorded with an application program for accomplishing the unallocatable space depicting method are also provided.

20 Claims, 9 Drawing Sheets

UNALLOCATABLE SPACE DEPICTING SYSTEM AND METHOD FOR A COMPONENT ON A PRINTED CIRCUIT BOARD

FIELD OF THE INVENTION

This invention relates to printed circuit board design systems and methods and, more particularly, to a computer-enabled depicting system for depicting an unallocatable space for a component on a printed circuit board and a depicting method thereof.

DESCRIPTION OF RELATED ART

Printed circuit boards (PCBs) are widely used in various electronic apparatuses, such as computers, information storage apparatuses, mp3s, cell phones, and televisions. In general, a printed circuit board carries and electrically interconnects a plurality of components including resistors, capacitors, integrated circuits (ICs), and connectors.

A general electronic apparatus includes not only one or more PCBs having some components mounted thereon but also some mechanisms. Each component of the PCBs and each mechanism occupy a specific space inside the electronic apparatus. When designing a PCB for an electronic apparatus, especially for an electronic apparatus in a compact and irregular structure, spaces occupied by the components on the PCB should be considered. For example, before a placement of a capacitor having a height of 20 mm on the PCB, an unallocatable space having a height not less than 20 mm should be indicated so as to provide references for selecting and design of other components on the printed circuit board. It is a tedious task to depict the unallocatable spaces of the components mounted on the PCB, especially when the components have irregular shapes.

Therefore, an unallocatable space depicting system and method for depicting the unallocatable spaces of the components is desired.

SUMMARY OF THE INVENTION

An unallocatable space depicting system is provided for depicting an unallocatable space for a component. The component forms a component shape on a printed circuit board layout. The unallocatable space depicting system includes a detecting module, a comparison module, and an incorporating module. The detecting module is used for detecting used shapes in the component shape and a gap in the used shape. The comparison module is used for comparing a width of a detected gap with a required width. The incorporating module is used for incorporating the gap whose width is less than the required width with the used shape to construct the unallocatable space.

An unallocatable space depicting method includes steps of: detecting the component shape to determine whether there is a space between each two used shape when the number of the used shapes is more than one; comparing a width of the detected space with the required width; and incorporating the detected space with the used shapes to construct the unallocatable space, when the width of the detected space is less than the required width.

A storage medium that is recorded with an application program is provided. The application program has a computer executable steps of: detecting the component shape to determine whether there is a space between each two used shape when the number of the used shapes is more than one; comparing a width of the detected space with the required width; and incorporating the detected space with the used shapes to construct the unallocatable space, when the width of the detected space is less than the required width.

Other advantages and novel features will become more apparent from the following detailed description of preferred embodiments when taken in conjunction with the accompanying drawings, in which:

BRIEF DESCRIPTION OF THE DRAWINGS

Many aspects of the unallocatable space depicting system and the unallocatable space depicting method thereof can be better understood with reference to the following drawings. The components in the drawings are not necessarily to scale, the emphasis instead being placed upon clearly illustrating the principles of the present disc drive. Moreover, in the drawings, like reference numerals designate corresponding parts throughout the several views.

DETAILED DESCRIPTION OF THE INVENTION

Reference will now be made to the drawings to describe the preferred embodiment of the present unallocatable space depicting system, in detail.

Figure 1:
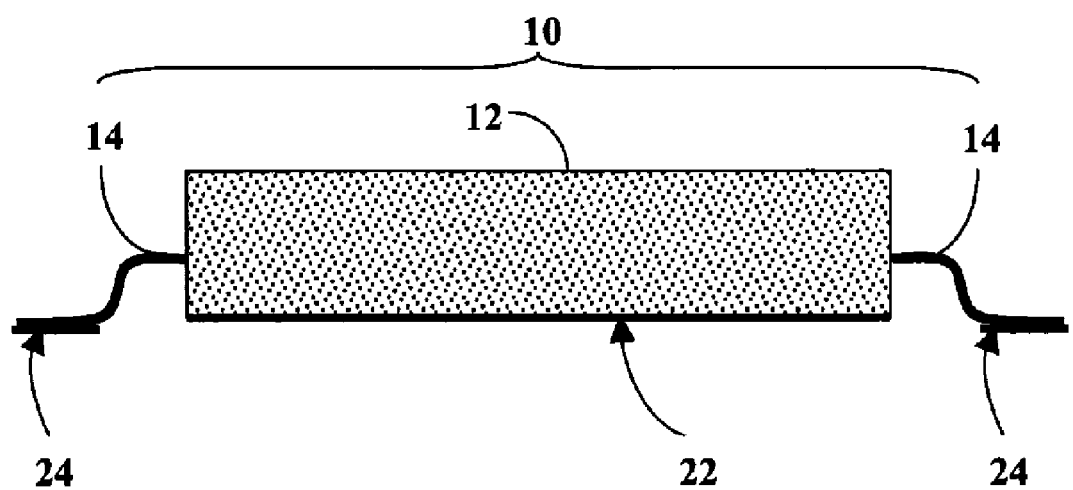
FIG. 1 is a cross sectional view of a component mounted on a PCB.
Figure 2:
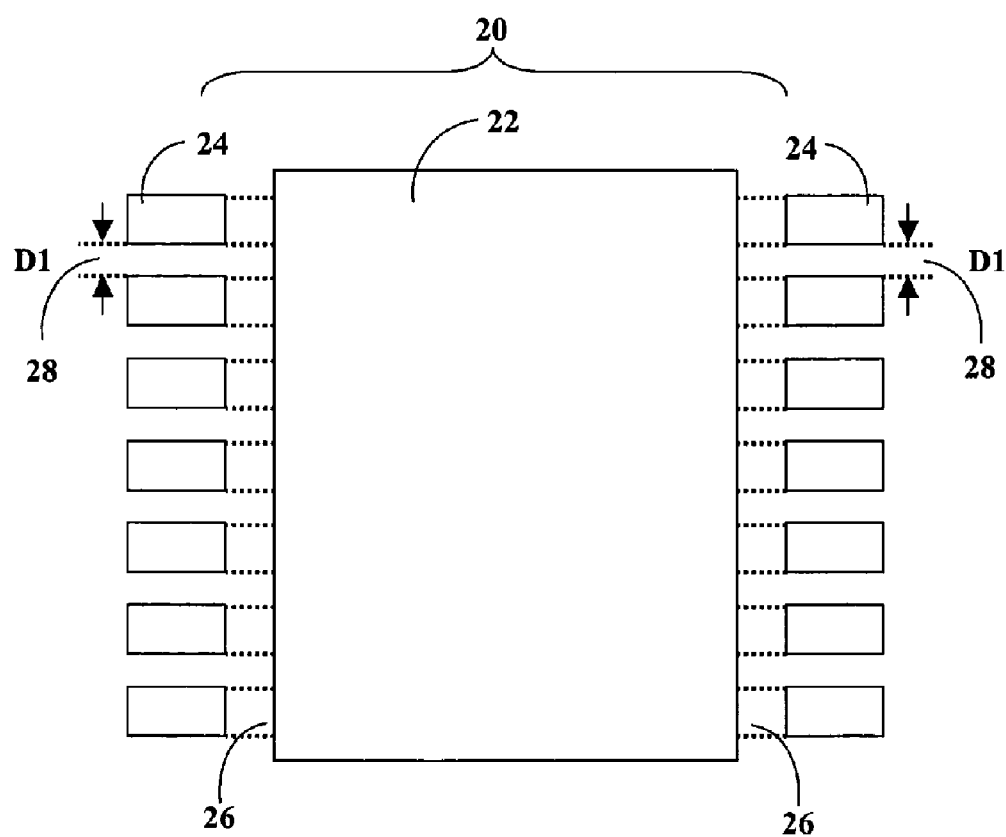
FIG. 2 is a schematic diagram showing a first component shape on the PCB, the first component shape including a body shape and a plurality of pin shapes.

Referring to FIG. 1 and FIG. 2, a first component 10 mounted on a PCB (not shown) includes a body 12 and a plurality of pins 14 soldered on the PCB via pads (not labeled). The first component 10 is mounted on the PCB and forms a first component shape 20 on the PCB. The component shape 20 represents a bottom shape of the first component 10, and includes a body shape 22 covered by the body 12 and a plurality of pin shapes 24 covered by the pads. The pin shapes 24 and the body shapes 22 are spaced by a plurality of first unused spaces 26. Each pair of adjacent pin shapes 24 is spaced by an unallocated space 28 with a width of D1. In this exemplary embodiment, for ease of description, the widths of the first unused spaces 26 are identical, and the widths of the second unused spaces 28 are identical. In other alternative embodiments, widths of the first unused spaces 26 and the second unused spaces 28 may be different to each other.

Figure 3:
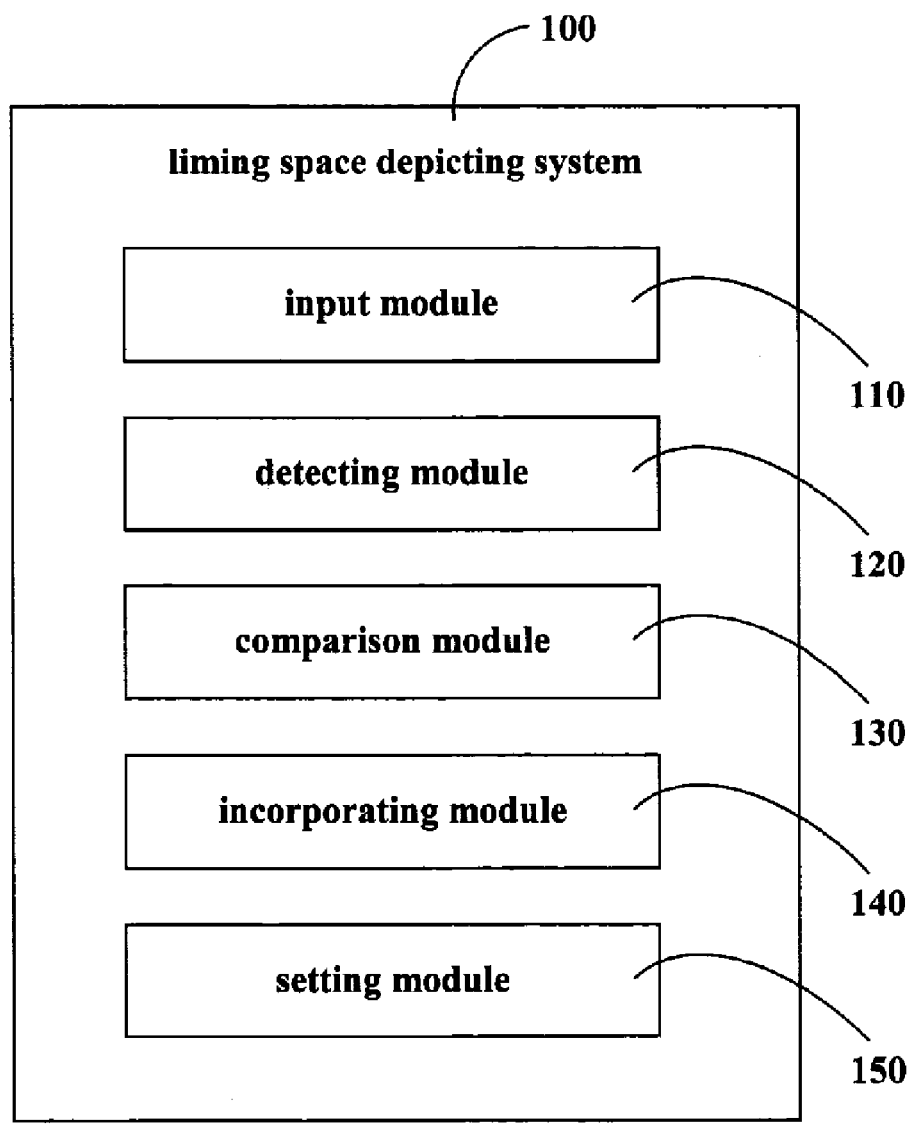
FIG. 3 is a block diagram of an unallocatable space depicting system in accordance with an exemplary embodiment.

Referring to FIG. 3, a block diagram of an unallocatable space depicting system 100 in accordance with an exemplary embodiment is illustrated. The unallocatable space depicting system 100 includes an input module 110, a detecting module 120, a comparison module 130, an incorporating module 140, and a setting module 150. The input module 110 is used for entering a required width D. The required width D represents a minimum width of a space that is allocatable to other components or mechanisms. For example, if the width D1 of the second unused space 28 is less than the required width D, the second unused space 28 is not allocatable to other components or mechanisms. The input module 110 is also used for entering a given height of the first component 10.

Figure 4:
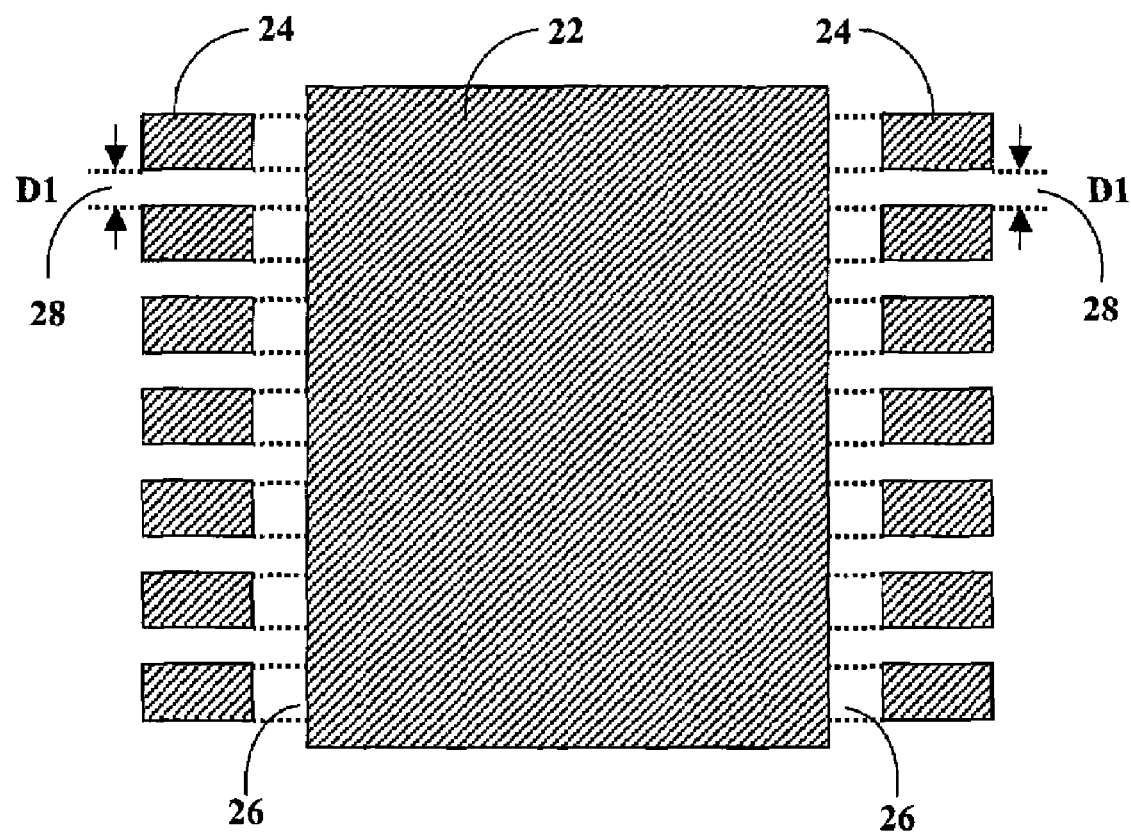
FIG. 4 is a schematic diagram showing the component shape of FIG. 2 with the body shape and the pin shapes filled with specific patterns.

The detecting module 120 is used for detecting the first component shape 20 of the first component 10 to find used shapes (such as the body shape 22, and the pin shapes 24). When any used shape is found, the detecting module 120 fills the used shapes with specific patterns to distinguish the used shapes from other areas (referring to FIG. 4). The detecting module 120 is also used for identifying the used shape representing the body shape based on an area of each used shape. The used shape with a greatest area is the body shape 22. The other used shapes position at a periphery of the body shape, are identified as the pin shapes 24 by the detecting module 120. The detecting module 120 is further used for detecting the width D1 of the second unused space 28 between each pair of adjacent pin shapes 24.

The comparison module 130 is used for determine whether the width D1 of the second unused space 28 between each pair of adjacent pin shapes 24 are less than the required width D.

Figure 5:
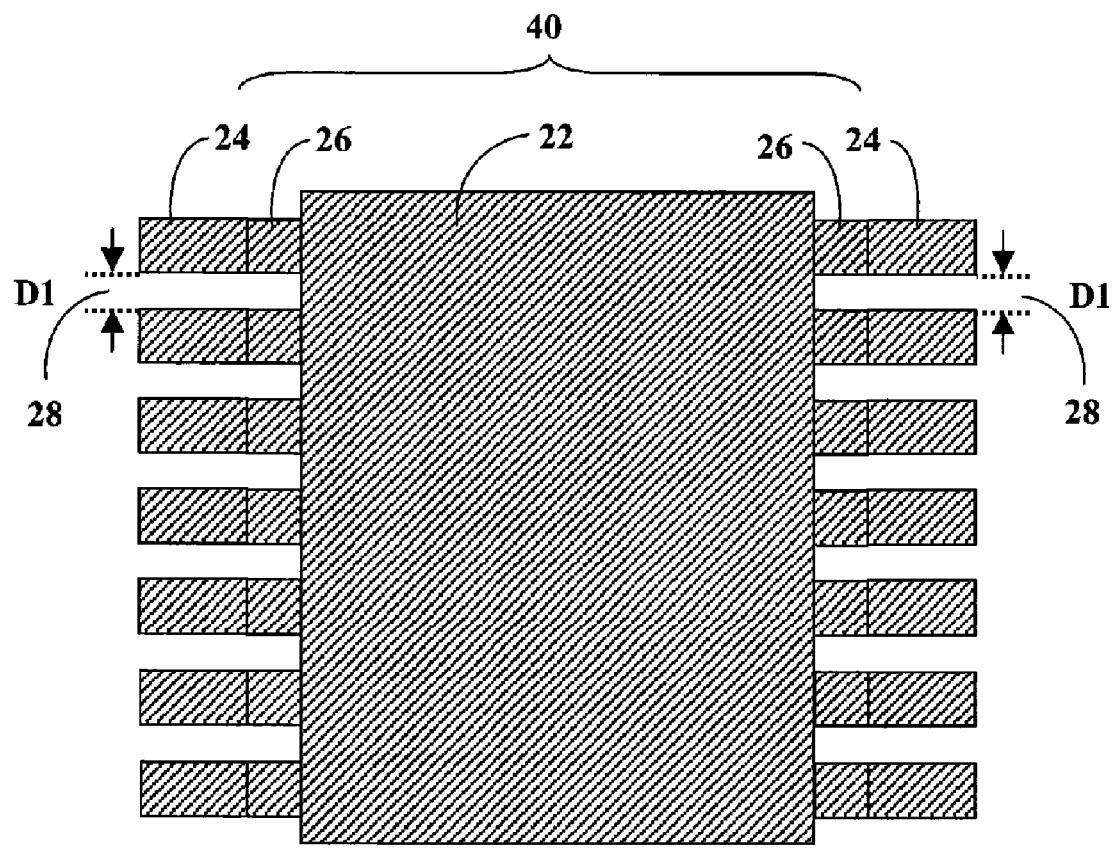
FIG. 5 is a schematic diagram showing a first unallocatable space of the component of FIG. 1.
Figure 6:
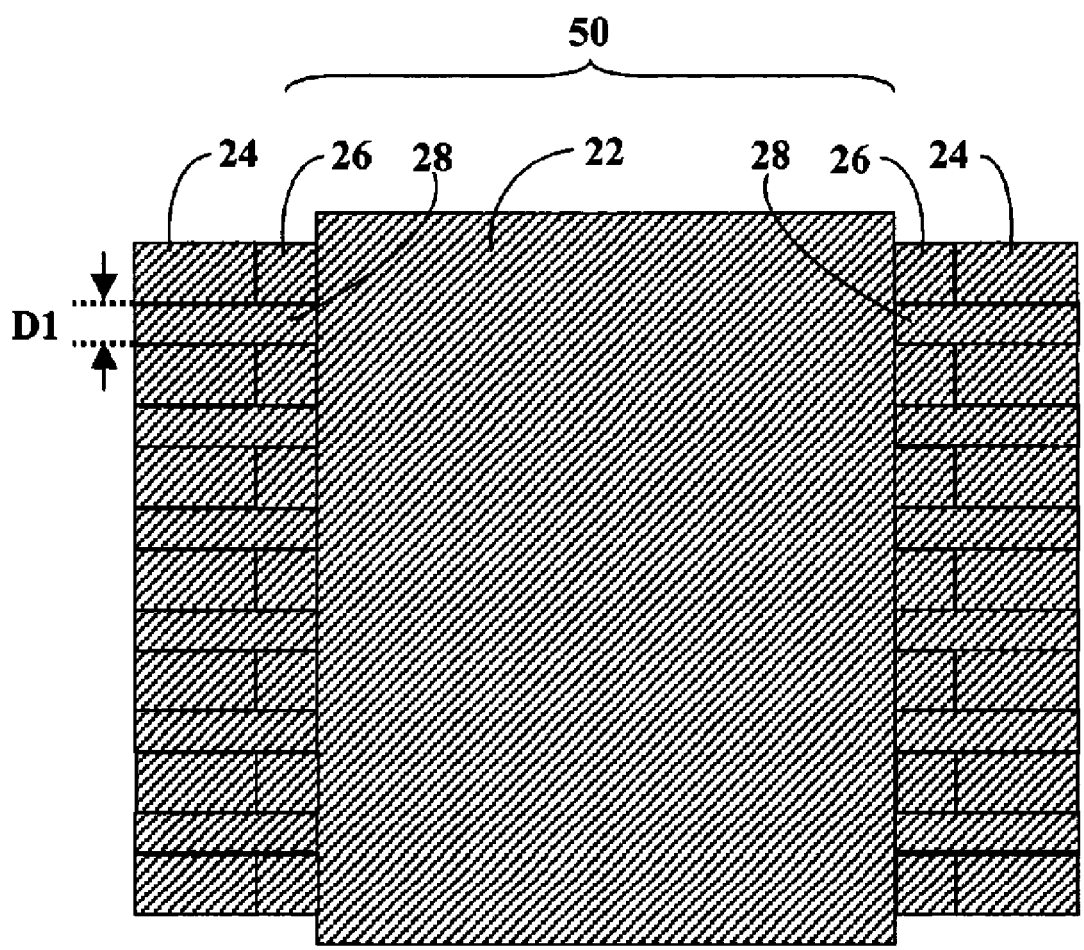
FIG. 6 is a schematic diagram showing a second unallocatable space of the component of FIG. 1.

Because the first unused spaces 26 are covered by the pins 14, they cannot be allocatable to other components and mechanisms. In order to reduce lines to construct an unallocatable space of the first component 10, the spaces around the first component shape 20, those unallocatable to other components and mechanisms should be incorporated into the unallocatable space. The incorporating module 140 is used for incorporating the first unused spaces 26 with the first component shape 20 to construct a first unallocatable space 40 (referring to FIG. 5). The incorporating module 140 is also used for incorporating the second unused spaces 28 between each pair of adjacent pin shapes 24 with the first unallocatable space 40 to construct a second unallocatable space 50 if the width D1 of the second unused space 28 is less than the required width D (referring to FIG. 6).

The setting module 150 is used for setting a height of the unallocatable space of the first component 10 based on a height of the first component 10. The height of the first component 10 can be obtained from the input module 110, or from a predetermined height that is previously stored in the unallocatable space depicting system 100. The setting module 150 is also used for setting a height range between a maximum height and a minimum height.

Figure 7:
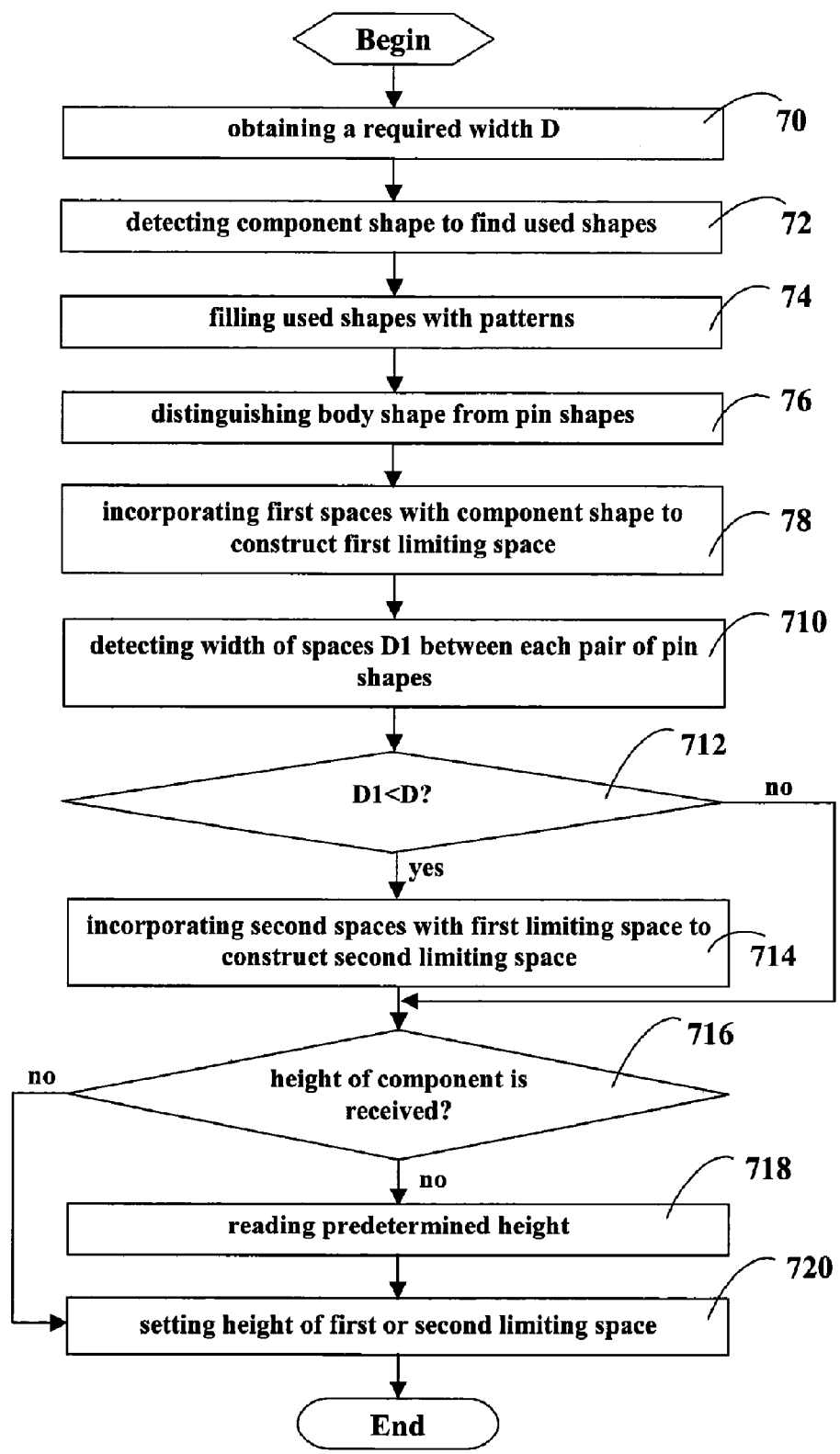
FIG. 7 is a flow chart illustrating a depicting procedure of the unallocatable space depicting system of FIG. 3.

Referring to FIG. 7, a depicting procedure of the unallocatable space depicting system of FIG. 3 is illustrated. Firstly, in step 70, the input module 110 receives a required width D. Secondly, in step 72, the detecting module 120 detects the first component shape 20 to find the used shapes. When the used shapes are found, in step 74, the detecting module 120 fills the used shapes with the specific patterns to distinguish the used shapes from other areas. Then, in step 76, the detecting module 120 distinguishes the body shape 22 from the pin shapes 24. Successively, in step 78, the incorporating module 140 incorporates the first unused spaces 26 with the used shapes to construct the first unallocatable space 40. Then in step 710, the detecting module 120 detects the width D1 of the second unused space 28.

In step 712, a conclusion is made as to whether the width D1 of the second unused space 28 is less than the required width D. If the width D1 of the second unused space 28 is less than the required width D, the procedure proceeds to step 714, otherwise the procedure proceeds to step 716. In step 714, the incorporating module 140 incorporates the second unused spaces 28 with the first unallocatable space 40 to construct the second unallocatable space 50.

Then in step 716, a conclusion is made as to whether the height or the height range of the first component 10 is received from the input module 110. If the height or the height range of the first component 10 is received, the procedure proceeds to step 720, otherwise the procedure proceeds to step 718. In step 718, the setting module 150 reads the previously stored height or the height range of the first component 10. Finally, in step 720, the setting module 150 sets the height of the first or second unallocatable space 40 or 50.

As for the first component 10, the pin shapes 24 are located around the body shapes 22. There are some other components whose pin shapes are covered by their body shape. Such components include connectors and components mounted on an IC that is in a ball grid array (BGA) package. In such instance, the pin shapes are not shown, and the depicting module finds only one used shape. After finding the used shape, the depicting module 120 detects the used shape to determine whether there is a gap. If a gap is detected, the comparison module 130 determines whether a width of the gap is less than the required width D. If the width of the gap is less than the required width D, the gap with a width that is less than the required width D is incorporated with the used shape by the incorporating module 140 to construct the unallocatable space of the component.

Figure 8:
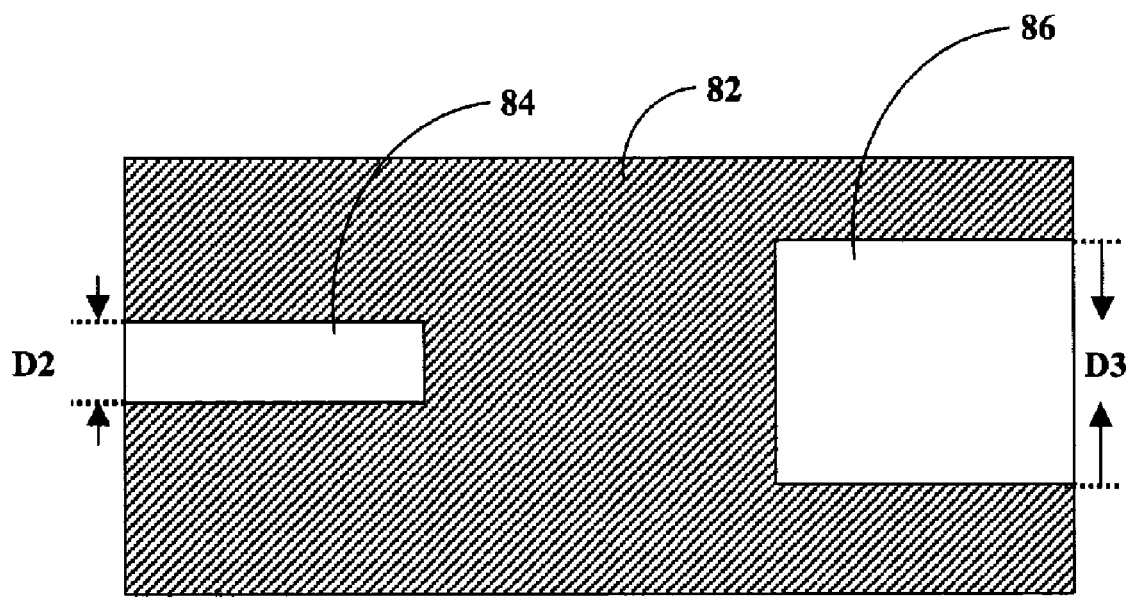
FIG. 8 is a schematic diagram showing a second component shape of a second component on the PCB, with pin shapes being covered by a body shape of the second component shape.
Figure 9:
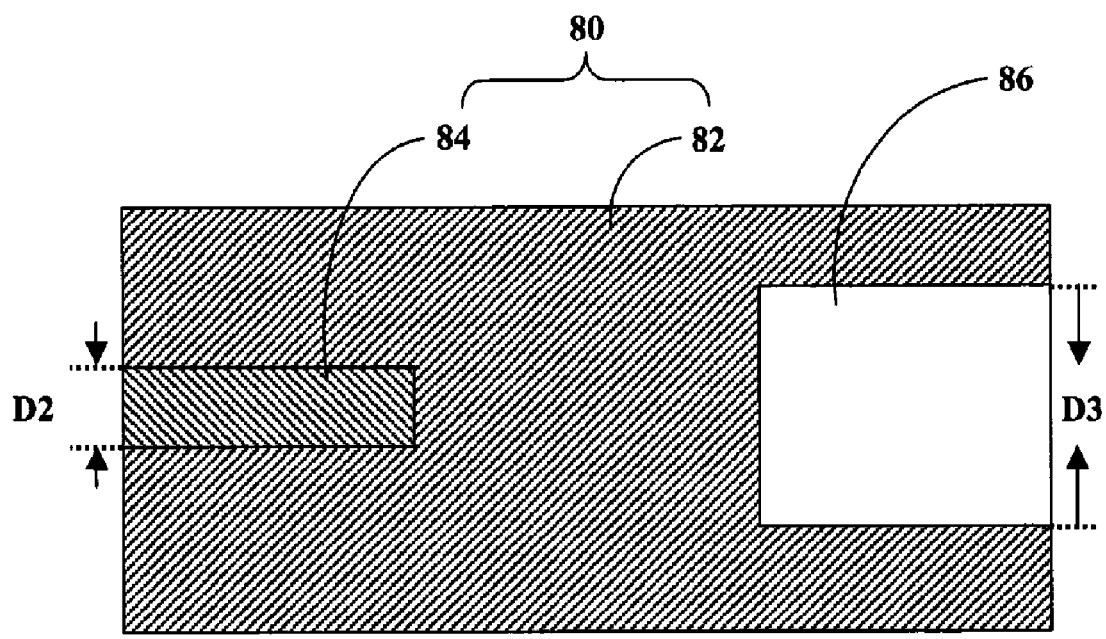
FIG. 9 is a schematic diagram showing an unallocatable space for the second component of FIG. 8.

Referring to FIGS. 3, 8 and 9, an exemplary second component shape 82 for a second component whose pin shapes (not shown) are covered by its body shape (referred as to the second component shape) 82. The detecting module 120 detects the second component shape 82 to find used shapes. The component shape 82 is the only one used shape. Then the detecting module 120 detects the component shape 82 to determine whether there is a gap in the component shape 82. When a first gap 84 with a first width D2 and a second gap 86 with a second width D3 are detected, the comparison module 130 compares the first width D2 and the second width D3 with the required width D to determine whether the first width D2 and the second width D3 are less than the required width D. After comparison, the first width D2 is concluded less than the required width D while the second width D3 is concluded greater than the required width D. Then the incorporating module 140 incorporates the first gap 84 with the second component shape 82 to construct an unallocatable space 80 for the second component.

The embodiments described herein are merely illustrative of the principles of the present invention. Other arrangements and advantages may be devised by those skilled in the art without departing from the spirit and scope of the present invention. Accordingly, the present invention should be deemed not to be unallocatable to the above detailed description, but rather by the spirit and scope of the claims that follow, and their equivalents.

What is claimed is:

1. An unallocatable space depicting system for depicting an unallocatable space of a component mounted on the printed circuit board, the unallocatable space depicting system comprising:

a detecting module configured for detecting used shapes and unused spaces of the component, the used shapes indicating a bottom shape of the component on the printed circuit board, the unused spaces consisting of first unused spaces above each of which there is at least one entity part, and second unused spaces above each of which there is no entity part;

a comparison module configured for comparing a width of each one of the second unused spaces with a required width predetermined as a threshold value in designing an allocatable space for mounting other components;

an incorporating module configured for incorporating the used shapes and the first unused spaces to construct the unallocatable space when none of the second unused spaces has a width less than the required width; and a computer for outputting information that the unallocatable space of the printed circuit board cannot be used to mount other components to users.

2. The unallocatable space depicting system as claimed in claim 1, wherein the incorporating module is also configured for incorporating one of the second unused spaces with the used shapes and the first unused spaces to construct the unallocatable space when the width of the one of the second unused spaces is less than the required width.

3. The unallocatable space depicting system as claimed in claim 1, wherein the detecting module is also configured for filling the used shapes of the component shape to distinguish the used shapes from the unused spaces and other areas of the printed circuit board.

4. The unallocatable space depicting system as claimed in claim 1, further comprising an input module for entering the required width.

5. The unallocatable space depicting system as claimed in claim 4, further comprising a setting module for setting a height of the unallocatable space based on a given height of the component.

6. The unallocatable space depicting system as claimed in claim 5, wherein the input module is also configured for entering the given height of the component.

7. The unallocatable space depicting system as claimed in claim 5, wherein the given height of the component is previously stored in the unallocated space depicting system.

8. An unallocatable space depicting method for depicting an unallocatable space of a component mounted on the printed circuit board, the unallocatable space depicting method comprising steps of:

detecting used shapes of the component;

detecting the component shape to determine whether there is at least one first unused space above which there is at least one entity part;

incorporating the at least one first unused space with the used shapes to construct the unallocatable space if the at least one first unused space is detected in the component;

constructing the unallocatable space from the used shapes if the at least one first unused space is not detected in the component; and outputting information that the unallocatable space of the printed circuit board cannot be used to mount other components to users.

9. The unallocatable space depicting method as claimed in claim 8, further comprising a step of detecting the component shape to determine whether there is at least one second unused space above which there is no entity part.

10. The unallocatable space depicting method as claimed in claim 8, further comprising a step of comparing a width of the at least one second unused space with a required width predetermined as a threshold value in designing an allocatable space for mounting other components.

11. The unallocatable space depicting method as claimed in claim 10, further comprising a step of incorporating the at least one first unused space with the used shapes to construct the unallocatable space if the width of the at least one second unused space is greater than or equal to the required width.

12. The unallocatable space depicting method as claimed in claim 10, further comprising a step of incorporating the at least one first unused space with the at least one second unused space and the used shapes to construct the unallocatable space if the width of the at least one second unused space is less than the required width.

13. The unallocatable space depicting method as claimed in claim 8, further comprising a step of receiving the required width from an input module.

14. The unallocatable space depicting method as claimed in claim 8, further comprising a step of setting a height of the unallocatable space based on a height of the component.

15. The unallocatable space depicting method as claimed in claim 8, further comprising a step of filling the used shapes of the component shape to distinguish the used shapes from the unused spaces and other areas of the printed circuit board.

16. A computer-readable medium having stored thereon instructions that, when executed by a computer in depicting an unallocatable space of a component mounted on the printed circuit board, cause the computer to:

detect used shapes of the component shape;

detect the component shape to determine whether there is at least one first unused space above which there is at least one entity part;

incorporate the at least one first unused space with the used shapes to construct the unallocatable space if the at least one first unused space is detected in the component;

construct the unallocatable space from the used shapes if the at least one first unused space is not detected in the component; and output information that the unallocatable space of the printed circuit board cannot be used to mount other components to users.

17. The computer-readable medium as claimed in claim 16, having stored thereon instructions that further cause the computer to detect the component shape to determine whether there is at least one second unused space above which there is no entity part.

18. The computer-readable medium as claimed in claim 16, having stored thereon instructions that further cause the computer to compare a width of the at least one second unused space with a required width predetermined as a threshold value in designing an allocatable space for mounting other components.

19. The computer-readable medium as claimed in claim 18, having stored thereon instructions that further cause the computer to incorporate the at least one first unused space with the used shapes to construct the unallocatable space if the width of the at least one second unused space is greater than or equal to the required width.

20. The computer-readable medium as claimed in claim 18, having stored thereon instructions that further cause the computer to incorporate the at least one first unused space with the at least one second unused space and the used shapes to construct the unallocatable space if the width of the at least one second unused space is less than the required width.

* * * * *